US012592710B2

(12) United States Patent
Lesso et al.

(10) Patent No.: US 12,592,710 B2
(45) Date of Patent: Mar. 31, 2026

(54) CIRCUITRY FOR MEASUREMENT OF ELECTROCHEMICAL CELLS

(71) Applicant: Cirrus Logic International Semiconductor Ltd., Edinburgh (GB)

(72) Inventors: John P. Lesso, Edinburgh (GB); James T. Deas, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 115 days.

(21) Appl. No.: 18/390,269

(22) Filed: Dec. 20, 2023

(65) Prior Publication Data

US 2025/0211246 A1 Jun. 26, 2025

(51) Int. Cl.
 H03M 1/12 (2006.01)
 H03M 1/66 (2006.01)
 H03M 3/00 (2006.01)

(52) U.S. Cl.
 CPC ......... H03M 1/1245 (2013.01); H03M 1/662 (2013.01); H03M 3/464 (2013.01)

(58) Field of Classification Search
 CPC ..... H03M 1/1245; H03M 1/662; H03M 3/464
 USPC ........................................ 341/155
 See application file for complete search history.

(56) References Cited

U.S. PATENT DOCUMENTS

2008/0006535 A1* 1/2008 Paik .................. B01L 3/502792
                                            204/600
2009/0120810 A1* 5/2009 Phan .................... A61B 5/1486
                                            205/792

2011/0051954 A1  3/2011  Thomsen et al.
2023/0061184 A1  3/2023  Lesso et al.
2023/0194451 A1  6/2023  Ligouras et al.
2023/0384390 A1  11/2023  Lesso

FOREIGN PATENT DOCUMENTS

WO    WO2008/093276 A1 *  8/2008  ............. B82Y 25/00

OTHER PUBLICATIONS

International Search Report and Written Opinion of the International Searching Authority, International Application No. PCT/GB2024/052725, mailed Jan. 21, 2025.
Rothe, Jorg, "Fully integrated CMOS microelectrode array for electrochemical measurements", Jan. 1, 2014, https://pdfs.semanticscholar.org/6116/aa5a0d660c9013a2d312331bb141e173c365.pdf, Chapter 3.

* cited by examiner

*Primary Examiner* — Peguy Jean Pierre
(74) *Attorney, Agent, or Firm* — Jackson Walker L.L.P.

(57) ABSTRACT

Circuitry for processing an analyte signal obtained from an electrochemical cell, the circuitry comprising: a converter, comprising: a first converter input configured to receive the analyte signal; a second converter input; and a converter output configured to output a converted analyte signal, the converter configured to generate the converted analyte signal in dependence on the analyte signal; a loop filter configured to filter a signal derived from the converted analyte signal to obtain a filtered analyte signal at a filter output; and a feedback path between the filter output and the second converter input.

29 Claims, 7 Drawing Sheets

100

102

200

202

CIRCUITRY FOR MEASUREMENT OF ELECTROCHEMICAL CELLS

TECHNICAL FIELD

The present disclosure relates to circuitry for measuring characteristics in electrochemical cells.

BACKGROUND

Electrochemical sensors are widely used for the detection or characterisation of one or more particular chemical species, analytes, typically as an oxidation or reduction current. Such sensors comprise an electrochemical cell, consisting of two or more electrodes configured for contact with an analyte whose concentration is to be ascertained.

For potentiostatic measurement, sensors may also comprise circuitry for driving one or more of the electrodes and for measuring a response signal at one or more of the electrodes. The measured response signal can be processed to determine a concentration of an analyte.

For potentiometric measurement, a potential difference is measured between an electrode and an analyte with no external bias and with no current flow. A working electrode (indicator electrode) of the electrochemical cell can be used as a proxy for the electrode, and a reference electrode can be used as a proxy for the analyte. Thus, the potential difference between the working electrode and the reference electrode gives an indication of a property of the electrode and the analyte. To ensure little or no current flows from the electrochemical cell, a high input impedance to any measurement circuitry is advantageous. Synthesizing such high input impedance can often require either active circuitry or complex process options which can lead to added cost and complexity.

SUMMARY

According to a first aspect of the disclosure, there is provided circuitry for processing an analyte signal obtained from an electrochemical cell, the circuitry comprising: a converter, comprising: a first converter input configured to receive the analyte signal; a second converter input; and a converter output configured to output a converted analyte signal, the converter configured to generate the converted analyte signal in dependence on the analyte signal; a loop filter configured to filter a signal derived from the converted analyte signal to obtain a filtered analyte signal at a filter output; and a feedback path between the filter output and the second converter input.

The feedback path may be a configurable feedback path. For example, the circuitry may be operable in an open loop mode in which the configurable feedback path is broken and the loop filter is bypassed, and a closed loop mode in which the configurable feedback path is closed. The circuitry may be operated in the open loop mode when the measurement to be performed on the electrochemical cell is a potentiostatic measurement. The circuitry may be operated in the closed loop mode when the measurement to be performed on the electrochemical cell is a potentiometric measurement. The circuitry may be operable in the open loop mode to apply a reference voltage at the second converter input when the feedback path is broken.

The loop filter may be coupled between the converter output and the filter output.

The loop filter may be an analog filter or a digital filter.

When the loop filter is implemented as a digital filter, the circuitry may further comprise: an analog-to-digital converter (ADC) configured to convert the converted analyte signal to a digital analyte signal at an ADC output, the signal derived from the converted analyte signal being the digital analyte signal. The circuitry may further comprise a digital-to-analog converter (DAC) in the configurable feedback path, the DAC operable to convert the filtered analyte signal to an analog input signal at the second converter input.

The loop filter may comprise an integrator.

The loop filter may be selectively coupled between the ADC output and the configurable feedback path. In the open loop mode, the circuitry may be configured to bypass the loop filter. In the closed loop mode, the circuitry may be configured to couple the loop filter between the ADC output and the configurable feedback path.

The circuitry may further comprise control circuitry configured to adapt the loop filter in dependence on the analyte signal.

The converter may comprise a current conveyor or a transimpedance amplifier (TIA).

Where the converter comprises a TIA, the loop filter may comprise a feedforward impedance of the TIA. The feedforward impedance may be coupled between the converter output and the first converter input.

In any case, the converter is preferably configured to mirror a voltage at the second converter input at the first converter input.

According to another aspect of the disclosure, there is provided circuitry for processing an analyte signal obtained from an electrochemical cell, the circuitry comprising: a converter, having a first converter input for receiving the analyte signal, a second converter input and a converter output for outputting a converted analyte signal, the converter configured to mirror a voltage at the second input at the first input; a loop filter configured filter the converted analyte signal to generate a filtered analyte signal at a filter output; a feedback path between the filter output and the second converter input.

The loop filter may be an analog filter. In which case, the filter may be configured such that the magnitude of the filtered converted analyte signal is substantially equal to the magnitude of the analyte signal.

The circuitry may further comprise an analog-to-digital converter (ADC) coupled between the converter output and the loop filter, the ADC configured to digitize the filtered converted analyte signal to obtain a digital analyte signal. The circuitry may then further comprise a digital-to-analog converter (DAC) coupled in the feedback path between the filter output and the second converter input, the DAC configured to convert the digital analyte signal to an analog input signal at the second converter input.

The loop filter may comprise an integrator.

The circuitry may further comprise a quantiser coupled between the loop filter and the feedback path, the quantiser configured to quantise the filtered analyte signal to generate a digital output signal. The circuitry may further comprise a digital-to-analog converter (DAC) provided in the feedback path, the DAC configured to convert the digital output signal to an analog input signal at the second converter input.

The circuitry may further comprise control circuitry operable to switch the circuitry between a potentiometric mode and a potentiostatic mode, wherein in the potentiostatic mode, the control circuitry is operable to break the feedback path and apply a reference voltage at the second converter input.

The circuitry may further comprise control circuitry configured to adapt the loop filter in dependence on the analyte signal.

According to another aspect of the disclosure, there is provided an integrated circuit (IC), comprising the circuitry as described above, and an external pin for configuring the circuitry in one of the open loop and closed loop modes.

According to another aspect of the disclosure, there is provided an integrated circuit (IC), comprising: first channel circuitry for processing a first analyte signal from a first electrochemical sensor; and second channel circuitry for processing a second analyte signal from a second electrochemical sensor. The first and second channels may each comprise the circuitry described above.

Each of the first and second channel circuitry may be configurable via one or more external pins of the IC.

According to another aspect of the disclosure, there is provided a multi-analyte sensor, comprising: an IC as described above, the first electrochemical sensor; and the second electrochemical sensor.

According to another aspect of the disclosure, there is provided a system comprising: the circuitry described above, the electrochemical cell.

The electrochemical cell may comprise a counter electrode and a first working electrode. The first electrode may be the first working electrode of the electrochemical cell.

The electrochemical cell may comprise a second working electrode.

The electrochemical cell may comprise an anode and a cathode, wherein the first electrode is the cathode.

According to another aspect of the disclosure, there is provided an electronic device, comprising a circuitry, IC or system as described above.

The electronic device may comprise one of an analyte monitoring device or an analyte sensing device, a battery, a battery monitoring device, a mobile computing device, a laptop computer, a tablet computer, a games console, a remote control device, a home automation controller or a domestic appliance, a toy, a robot, an audio player, a video player, or a mobile telephone, and a smartphone.

Throughout this specification the word "comprises", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Embodiments of the present disclosure relate to the measurement of signals (such as analyte signals) in electrochemical cells. In particular, embodiments relate to improved methods and circuitry for the characterisation of electrochemical cells using both potentiometric measurements and potentiostatic measurements.

Figure 1:
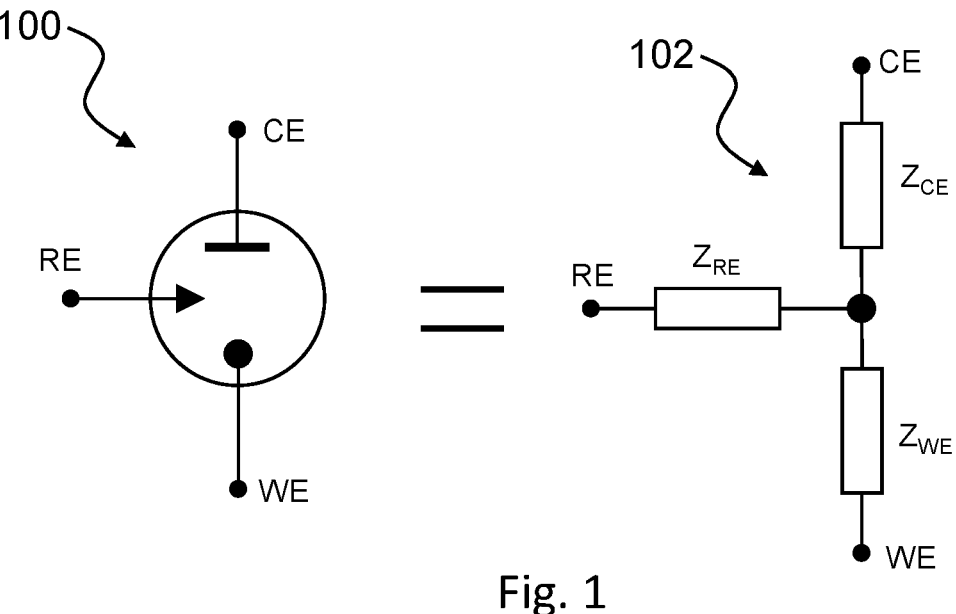
FIG. 1 illustrates a schematic diagram and electrical equivalent circuit for a three-electrode electrochemical cell.

FIG. 1 is a schematic diagram of an example electrochemical cell 100 comprising three electrodes, namely a counter electrode CE, a working electrode WE and a reference electrode RE. FIG. 1 also shows an equivalent circuit 102 for the electrochemical cell 100 comprising a counter electrode impedance ZCE, a working electrode impedance ZWE and a reference electrode impedance ZRE.

Figure 2:
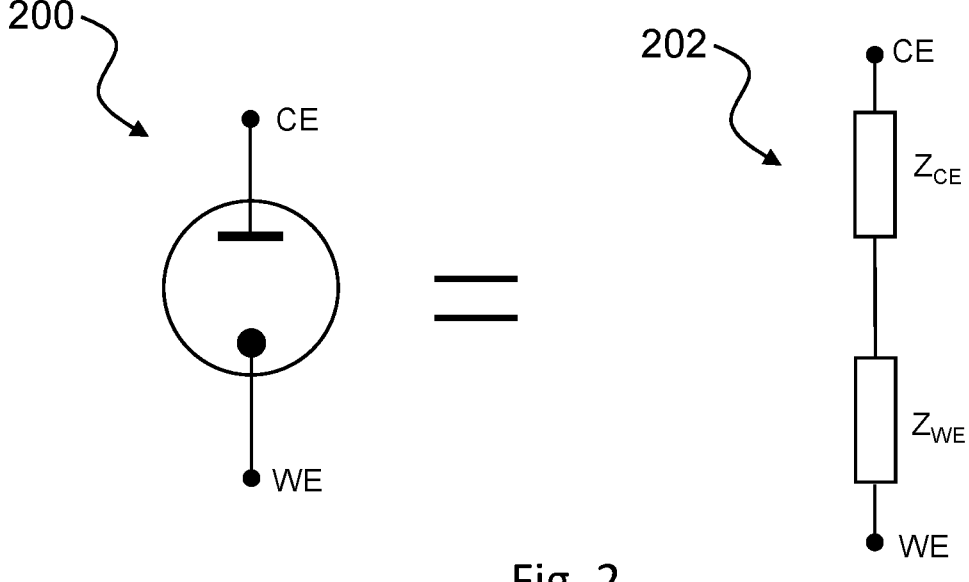
FIG. 2 illustrates a schematic diagram and electrical equivalent circuit for a two-electrode electrochemical cell.

FIG. 2 is a schematic diagram of another example electrochemical cell 200 comprising two electrodes, namely a counter electrode CE and a working electrode WE. The electrochemical cell 200 varies for the cell 100 with the omission of the reference electrode RE. FIG. 2 also shows an equivalent circuit 102 for the electrochemical cell 200 comprising a counter electrode impedance ZCE and a working electrode impedance ZWE.

In some embodiments, the working electrode WE comprise an assay or chemical of interest. For example for the analysis of glucose as an analyte, the working electrode may comprise a layer of glucose oxidase. The counter electrode CE is provided to form an electrical or ohmic connection with the working electrode WE. Optionally, the reference electrode is provided, which is typically a sensing point between the working electrode WE and the counter electrode CE, allowing independent measurement of the potential associated with each of the working and counter electrodes WE, CE, rather than just measuring a potential difference between the counter and working electrodes CE, WE.

Embodiments of the present disclosure will be described with reference to these example electrochemical cells 100, 200. It will be appreciated, however, that the techniques and apparatus described herein may be used in conjunction with any conceivable electrochemical system, including but not limited to electrochemical cells comprising at least two electrodes (e.g. a counter electrode CE, a working electrode WE and optionally a reference electrode RE), or electrochemical cells with more than three electrodes (e.g. two or more counter electrodes and/or two or more working electrodes). Electrodes of the electrochemical cells described herein may also be referred to as anodes and/or cathodes as is conventional in the field of electrical batteries.

The cells 100, 200 may be implemented for potentiometric measurement or potentiostatic measurement.

In potentiostatic arrangements, to determine a characteristic of either of the electrochemical cells 100, 200, and therefore an analyte concentration, it is conventional to apply a bias voltage at the counter electrode CE and measure a current at the working electrode WE. When provided, the reference electrode RE may be used to measure a voltage drop between the working electrode WE and the reference electrode RE. The bias voltage is then adjusted to maintain the voltage drop between the reference and working electrodes RE, WE constant. As the resistance in the cell 100 increases, the current measured at the working electrode WE decreases. Likewise, as the resistance in the cell 100 decreases, the current measured at the working electrode WE increases. Thus the electrochemical cell 100 reaches a state of equilibrium where the voltage drop between the reference electrode RE and the working electrode WE is maintained constant. Since the bias voltage at the counter electrode CE and the measured current at WE are known, the resistance of the cell 100 can be ascertained.

Figure 3:
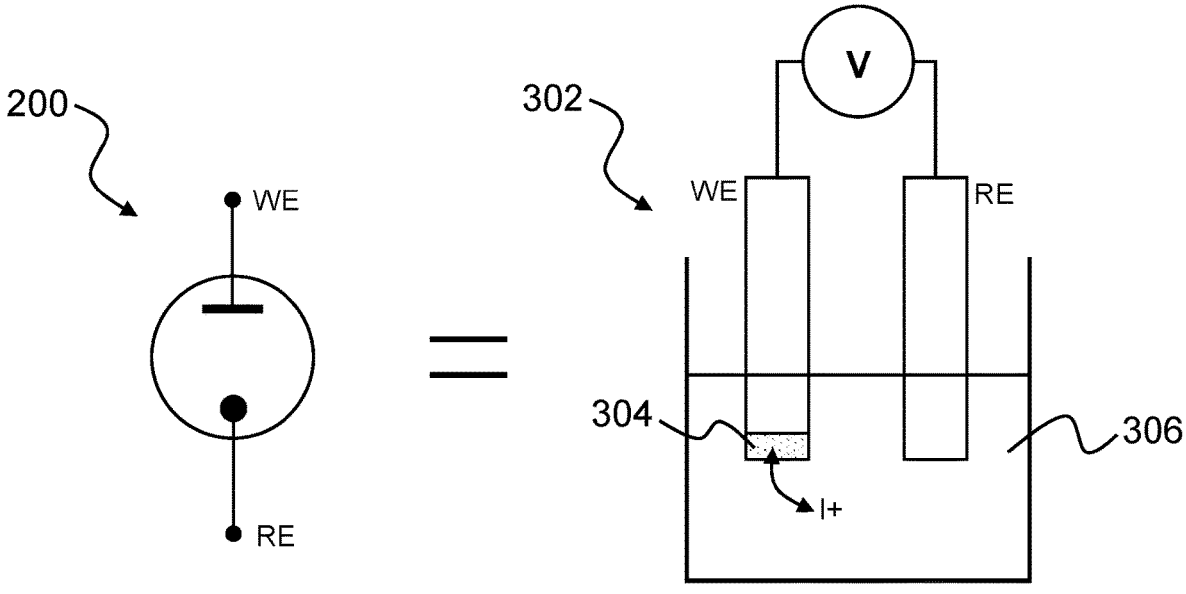
FIG. 3 illustrates a schematic diagram of a potentiometric sensor.

When the cells 100, 200 are configured for potentiometric sensing, a potential across the cells 100, 200 may be measured without applying any bias voltage to the cells 100, 200. As an example, FIG. 3 illustrates the electrochemical cell 200 of FIG. 2 alongside a schematic diagram of an example implementation of the electrochemical cell 200 as a potentiometric sensor. The working electrode WE comprises an ion-selective membrane 304, which may be configured to uptake only a specific ion (in this case the cation, I+) from an electrolyte solution 306. As such, the potential difference between the working electrode WE and the reference electrode RE depends on the concentration of that particular ion analyte in the electrolyte solution 306.

To accurately measure the potential difference across the cell 200, as little as possible current (ideally no current) need flow into the cell 200. Hence, a typical approach to voltage measurement is to couple each of the working and reference electrodes WE, RE to high input impedance buffers which are used, in turn, to drive one or more ADCs (e.g. two single ended ADCs or one differential ADC). A digital output signal is then derived which represents the potential difference between working and reference electrode WE, RE of the cell 200.

Figure 4:
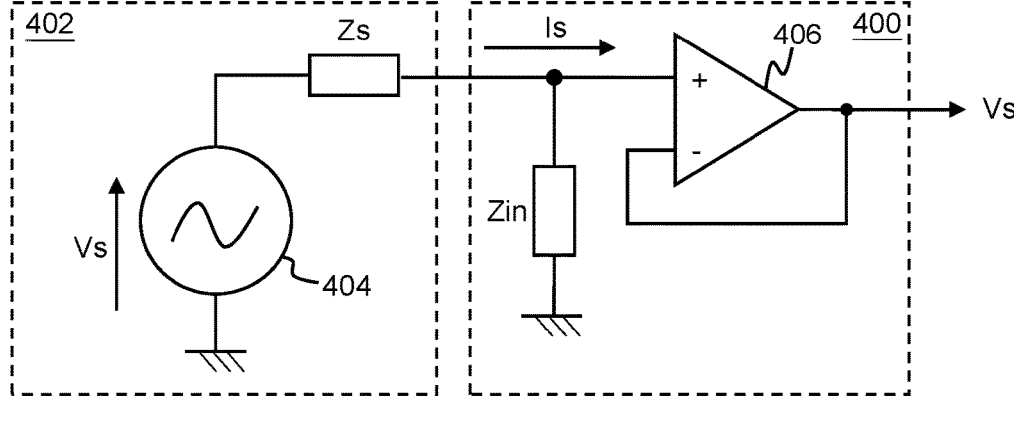
FIG. 4 is a schematic diagram of a known high input impedance measurement circuit.

FIG. 4 is a schematic diagram of a typical measurement circuit 400 for measuring a potential difference Vs across the two-electrode cell 200 implemented as a potentiometric sensor. An equivalent circuit model 402 for the cell 200 is shown in FIG. 4. The model comprises a voltage source 404 (generating the potential difference or sense voltage Vs) and a series impedance Zs coupled. The voltage source 404 is coupled between a reference voltage (in this case ground) and the series impedance Zs which itself is coupled to an input of the measurement circuit 400. The measurement circuit 400 comprises a buffer amplifier 406 and an input impedance Zin. A non-inverting input of the buffer amplifier 406 is coupled to the series impedance Zs of the cell 200. The input impedance Zin is coupled between the non-inverting input of the buffer amplifier 406 and a reference voltage (in this case ground). An inverting input and output of the buffer amplifier 406 are coupled together. Thus, the measurement circuit 400 is configured as a high input impedance buffer amplifier which buffers the sense voltage Vs across the cell 200 to the output of the measurement circuit 400.

The input impedance Zin of the measurement circuit 400 is typically an order of magnitude higher than the series impedance Zs of the cell 200. With electrochemical sensors typically having an impedance in the gigaohm range (e.g. 1-10 GΩ), this can lead to the measurement circuit 400 having an input impedance Zs in the order of teraohms (e.g. 1-10 TΩ). To operate at such high input impedance, the measurement circuit 400 is required to have low leakage. Such operation can lead to high power consumption and large circuit area. Additionally, synthesizing the required input impedance Zin can require either active circuitry or complex process options which can lead to added cost and complexity. Despite such efforts, the circuit 400 tends to show undesirable temperature dependence.

Embodiments of the present disclosure aim to address or at least ameliorate one or more of the above issues by providing novel methods of synthesizing the desired input impedance of measurement circuitry using standard CMOS devices without resorting to complex process options or excess active circuitry. Specifically, it is proposed to provide a circuit element, such as a current conveyor or transimpedance amplifier (TIA), in a feedback loop configured to match the sense voltage Vs of the cell 200 to the input voltage of the circuit element.

Figure 5:
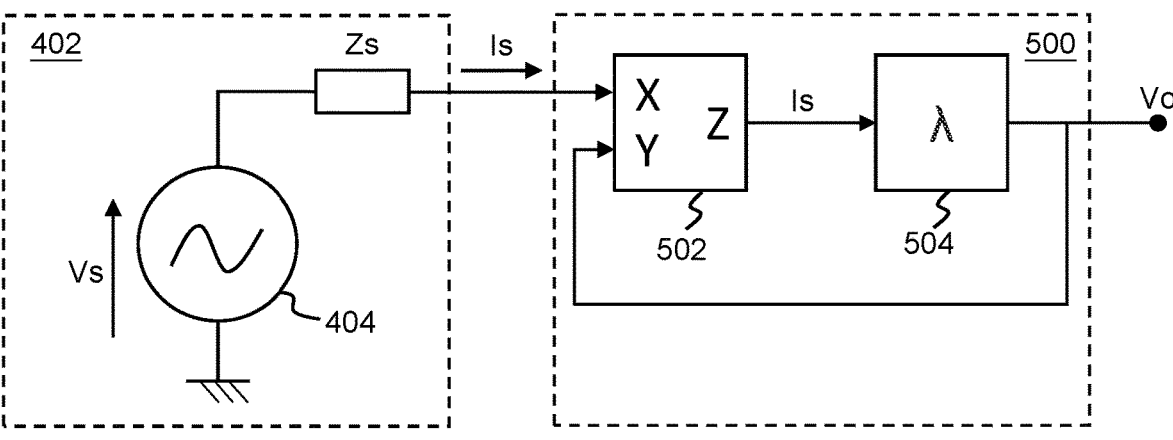
FIGS. 5 to 13 are schematic diagrams of measurement circuits according to embodiments of the present disclosure.

FIG. 5 is a schematic diagram of a measurement circuit 500 according to embodiments of the present disclosure coupled to the equivalent circuit 402 of the cell 200.

The measurement circuit 500 comprises a converter 502 and a loop filter 504.

The converter 502 comprises first input X, a second input Y and an output Z. A characteristic of the converter 502 is its ability to establish on its first input X a voltage equal to the voltage provided to its second input Y. In the example shown in FIG. 5, the converter 502 comprises a current conveyor (CC) configured to buffer an input current Is whilst maintaining a voltage at the first input X equal to a voltage applied to the second input Y. Another example of a circuit element which exhibits such a characteristic is a transimpedance amplifier (TIA). When the converter 502 is implemented as a TIA, a voltage at its output Z may be representative of an input current at its first input X.

An input of the measurement circuit 500 is coupled to the first input X of the converter 502, such that the cell 200 is coupled to the first input X of the converter 502. The output Z of the converter 502 is coupled to an input of the loop filter 504. An output of the loop filter 504 is coupled to an output of the measurement circuit 500. The output of the loop filter 504 is also coupled to the second input Y of the converter 502 so as to provide a feedback loop.

During operation, the converter 502 is configured to buffer a sense current Is, received from the cell 200 and provided to the first input X, to the output Z. The filter 504 is configured to filter the sense current Is to generate an output signal Vo at the output of the measurement circuit 500.

The feedback loop acts to drive the output signal Vo to be the same as the sense voltage Vs across the cell 200. In doing so, this forces the sense current Is to zero. Hence, the loop filter 504 acts to synthesize a large input impedance at the first input X (and therefore the input of the measurement circuit 500) without the need for a high impedance element at the input.

To implement the above, the loop filter 504 may be designed to synthesize a desired impedance Zin as a function of frequency. The synthesized impedance Zin, which may be equal to the gain λ applied by loop filer 504, may satisfy the following equation:

$$\lambda = Z_{in} = \frac{dV_o}{dI}$$

To determine the gain λ to be used for the loop filter 504, we can approximate the relationship between the output voltage Vo and sense voltage Vs as follows:

$$\frac{V_s - V_o}{Z_s} = I_S = \frac{V_o}{\lambda}$$

$$V_o Z_s = \lambda(Vs - V_o)$$

$$V_o(Z_s + \lambda) = \lambda Vs$$

$$V_o = Vs \frac{\lambda}{Z_s + \lambda}$$

The loop filter 504 may be implemented as a first order filter having a gain λ=1/sC, the sense impedance Zs being purely resistive, i.e. having a resistance Rs. For such a system, the output voltage Vo can be related to the sense voltage Vs by the following equation:

$$V_o = Vs \frac{1}{sCR_s + 1}$$

In the above example, the loop filter 504 may implement a fixed gain A. In some cases, it may be advantageous to adapt the filter 504 in response to changes in the sense voltage Vs.

For example, when initialising the circuit 500 (e.g. upon start up) the sense voltage Vs may be unknown. In which case, it may be advantageous to adjust the gain λ of the loop filter 504 to increase the loop bandwidth. Doing so will reduce the time taken for the loop to settle, particularly for an unknown value of the sense voltage Vs. Once the loop has settled or if an approximate value of the sense voltage Vs is known, the gain λ may be adjusted to reduce the loop bandwidth or preset to that lower loop bandwidth. By reducing the loop bandwidth (or starting at a lower loop bandwidth) unwanted tracking of noise at the input of the converter 502 may be reduced or avoided.

It may be advantageous to adjust the gain A of the loop filter 504 upon saturation of the output voltage Vo. For example, the transfer function of the loop filter 504 may be adjusted as a function of the output voltage Vo.

Figure 6:
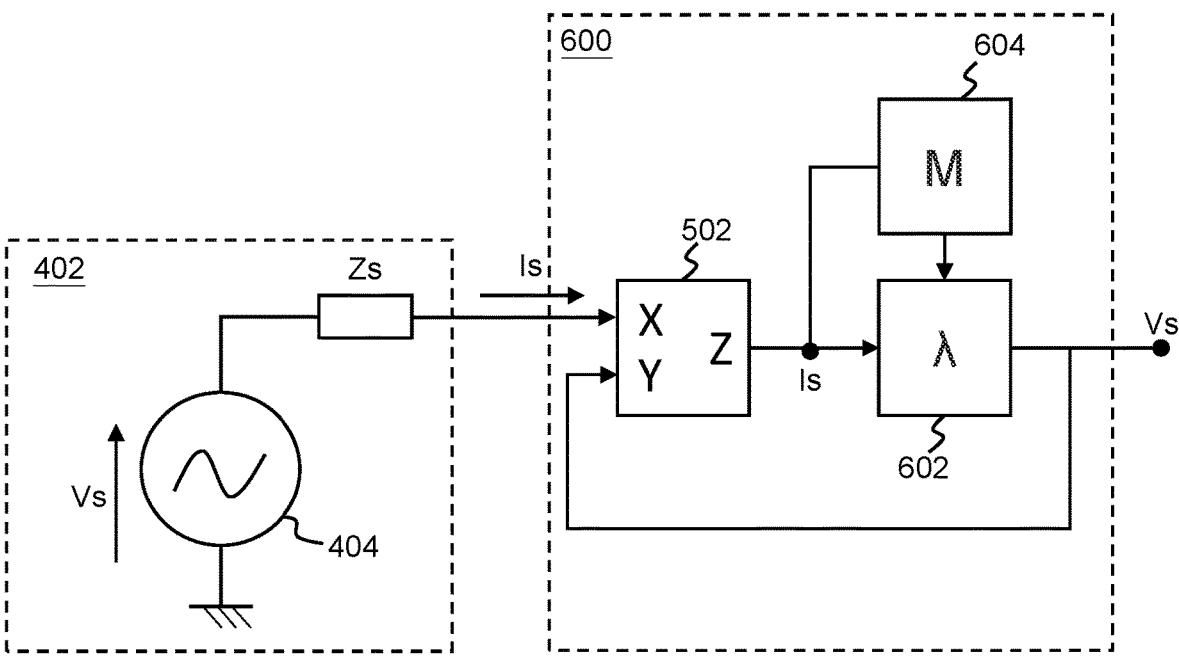

FIG. 6 is a schematic diagram of a measurement circuit 600 coupled to the equivalent circuit 402 of the cell 200. The measurement circuit 600 is a variation of the measurement circuit 500 of FIG. 5, differing in that the loop filter 504 has been replaced with an adaptive loop filter 602, and in that the circuit 600 further comprises adaptation circuitry 604 configured to control a transfer function of the adaptive loop filter 602 based on the signal output from the converter 502. The adaptation circuitry may be configured to implement any conceivable optimisation strategy. Adaptive filters are known in the art and so will not be described in more detail here.

It will be appreciated that whilst in the embodiments described above with reference to FIGS. 5 and 6 the loop filters 504, 602 are implemented in the analog domain, in other embodiments, loop filters may be implemented digitally, for example using a digital signal processor (DSP) or the like.

Figure 7:
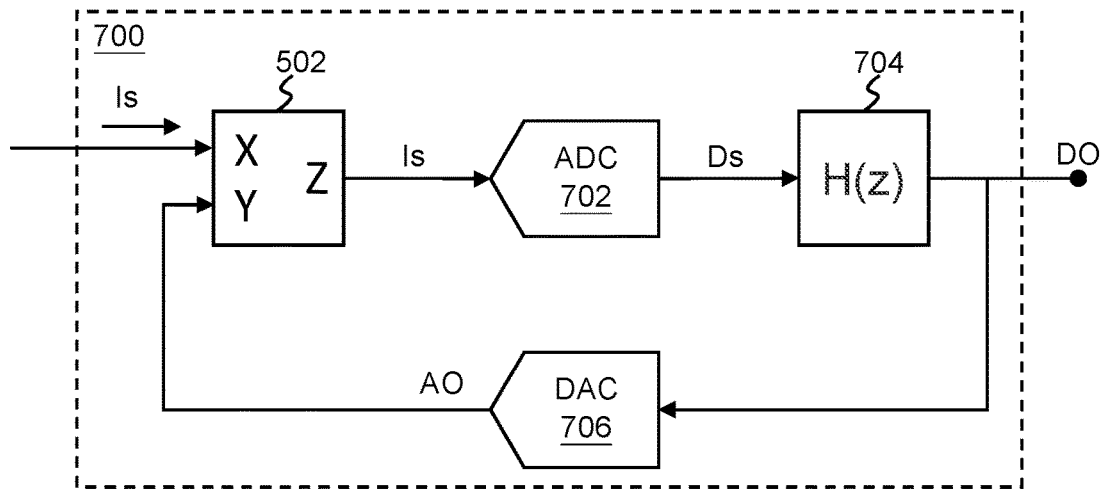

FIG. 7 is a schematic diagram of a measurement circuit 700 which is a digital equivalent to the measurement circuit 500 of FIG. 5, like parts being given like numbering. The measurement circuit 700 comprises the converter 502, an ADC 702, a digital loop filter 704 and a DAC 706. The output Z of the converter 502 is coupled to an input of the ADC 702 which converts the signal output from the converter 502 to a digital signal Ds representing the sensed current Is. The digital signal Ds is provided to the digital loop filter 704 which filters the digital signal Ds and outputs a digital output signal DO to an output of the measurement circuit 700. The digital output signal Do is also provided as an input of the DAC 706 which converts this signal to an output voltage Vo. The output voltage Vo is provided to the second input Y of the converter 502.

Like the analog feedback loop of the circuits 500, 600, the feedback loop of the circuit 700 acts to drive the output voltage Vo to be the same as the sense voltage Vs across the cell 200. In doing so, the sense current Is at the input of the first input X of the converter 502 to zero. Hence, the digital loop filter 704 acts to synthesize a large input resistance at the first input X (and therefore the input of the measurement circuit 700) without the need for a high impedance element at the input.

Like the loop filter 602 of the measurement circuit 600, digital loop filter 704 may be adaptive. In which case, adaptation circuitry (not shown) may be provided to adapt the transfer function H(z) of the digital loop filter 704 based on one or more of the sense current Is and the digital signal Ds.

For potentiometric measurements (such as when the cell 200 is a potentiometric sensor or a battery) the digital loop filter 704 may be configured as an integrator. For potentiostatic measurements (such as when the cell 200 is a potentiostat), neither of the digital loop filter 704 and the DAC 706 are required. The second input Y of the converter 502 can simply be held at a reference voltage, such as the voltage VWE at the working electrode WE of the cell 200. As such, circuitry may be provided to enable reconfiguration of the circuit 700 between potentiometric and potentiostatic measurement configurations.

Figure 8:
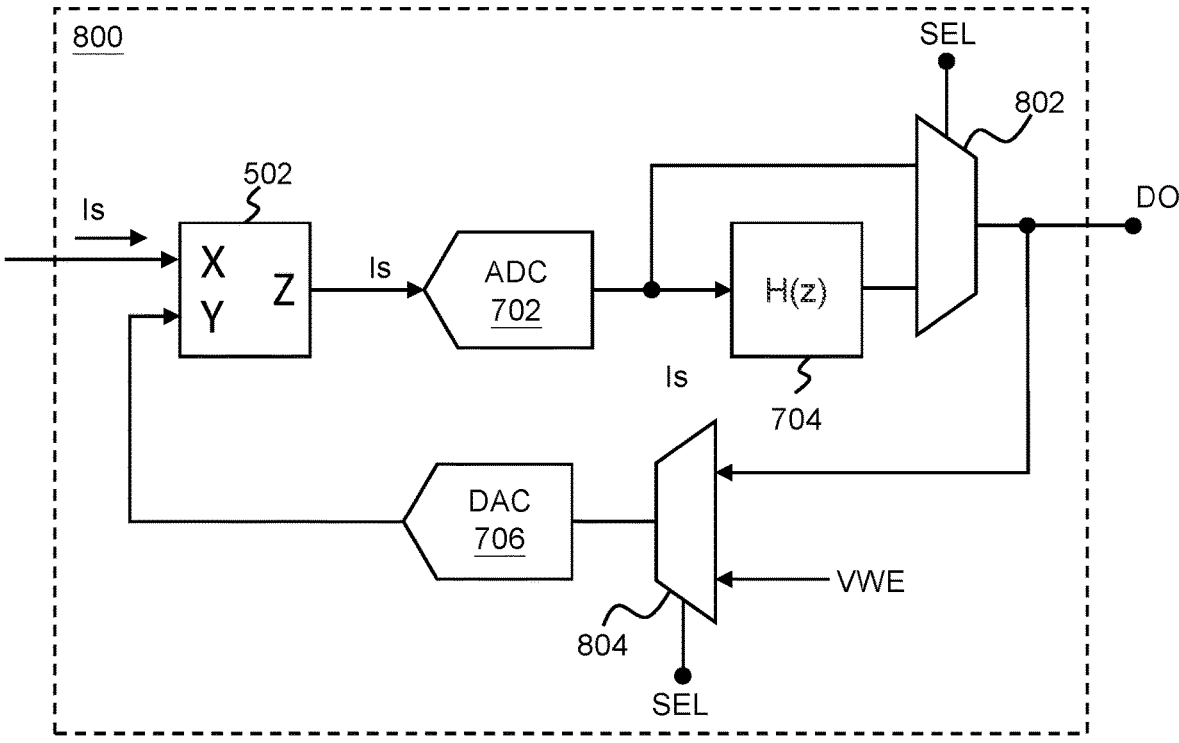

FIG. 8 is a schematic diagram of a measurement circuit 800 which is a variation of the circuit 700 of FIG. 7, like parts being given like numbering. In addition to the elements provided in the measurement circuit 700, the measurement circuit 800 comprises a first multiplexer 802 and a second multiplexer 804.

The first multiplexer 802 comprises a first input, a second input, an output and a select input. The first input is coupled to an output of the digital loop filter 704. The second input of the first multiplexer 802 is coupled to the output of the converter 502. The output of the first multiplexer 802 is coupled to the output of the measurement circuit 800. Based on a select signal SEL received at the select input, the first multiplexer 802 is configured to select between, in a potentiometric mode, connecting the output of the digital loop filter 704 to the output of the measurement circuit 800 and, in a potentiostatic mode, connecting the output of the converter 502 directly to the output of the measurement circuit 800, therefore bypassing the digital loop filter 704.

Like the first multiplexer 802, the second multiplexer 804 also comprises a first input, a second input, an output and a select input. The first input of the second multiplexer 804 is coupled to the output of the first multiplexer 804. The second input of the second multiplexer 804 is coupled to a reference voltage (in this example the working electrode voltage VWE at the working electrode WE of the cell 200). The output of the second multiplexer 804 is coupled to the input of the DAC 706. The second multiplexer 804 receives the same select signal SEL as the first multiplexer 802 at its select input. Based on the select signal SEL, the second multiplexer 804 is configured to select between, in the potentiometric mode, connecting the output of the second multiplexer 804 to the input of the DAC 706 and, in the potentiostatic mode, connecting the reference voltage (VWE) to the input of the DAC 706.

During operation in the potentiometric mode, the select signal SEL is asserted such that the digital loop filter 704 is coupled between the ADC 702 and the output of the measurement circuit 800 via the first multiplexer 802 and to the DAC 706 via the first and second multiplexers 802, 804. To transition from the potentiometric mode to the potentiostatic mode, the select signal SEL may be asserted such that the digital loop filter 704 is bypassed, the ADC 702 coupled to the output of the circuit 800 via the first multiplexer 802, and the DAC 706 disconnected from the output of the measurement circuit 800, instead coupled to the reference voltage (in this example VWE). Thus, the in the potentiostatic mode, the voltage at the second input Y of the converter 502 is held at a fixed reference voltage VWE and the sense current Is is conveyed to the ADC 702 which converts the sense current Is to the digital output signal DO at the output of the measurement circuit 800.

In either of the measurement circuits 700, 800 shown in FIGS. 7 and 8, the resolution of the DAC 706 should be sufficient to ensure the sense current Is at the first input X of the converter does not exceed the compliance current of the cell 200 (or other sensor) connected to the first input X of the converter. The sense current Is may be defined as follows:

$$Is = \frac{\Delta V}{Z_s}$$

Where ΔV is the step resolution of DAC 706 and Zs is the impedance of the cell 200. A typical electrochemical cell has an impedance in the order of teraohms, e.g. 1 Tohm. With such an impedance 1 mV step change in voltage will result in a current in the order of femtoamps. The requirement for such a low resolution DAC 706 has advantages in terms of lower power consumption and decreased architectural complexity.

It will be appreciated that the digitally implemented feedback loops of the circuits 700, 800 described above may be modified to account for quantization effects associated with low loop bandwidth. For example, if the loop filter 704 has a very low bandwidth, this implies a large bit width at the output DO which can create challenges for implementing the DAC 706. Such challenges may be overcome or ameliorated by providing a Word Length Reduction (WLR) block at the input to the DAC 706 in the circuits 700, 800. However, quantization noise that this may introduce may not be optimally shaped. Hence, embodiments described above may be improved by the arrangement shown in FIG. 9.

Figure 9:
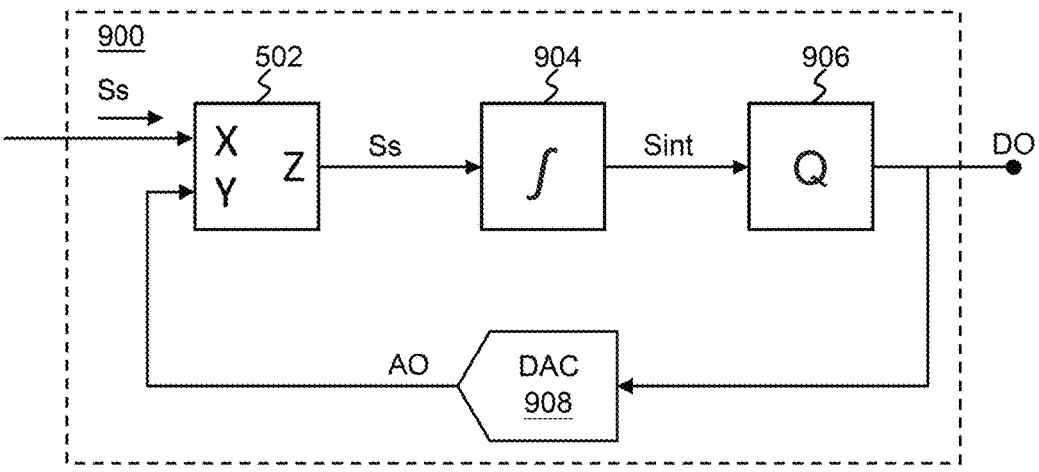

FIG. 9 is a schematic diagram of further measurement circuit 900 according to embodiments of the disclosure. In contrast to the circuit 700 of FIG. 7, instead of providing a separate ADC 702, in the circuit 900 the loop itself is used as an ADC. Thus, the measurement circuit 900 forms a sigma-delta ADC converting a current Is at its input to a digital output DO representing the current Is.

The measurement circuit 900 comprises the converter 502, an integrator 904, a quantiser 906 and a DAC 908. The first input X of the converter 502 is coupled to an input of the circuit 900 and is configured to receive a sense signal Is from an electrochemical cell, such as the cells 100, 200, and convey the sense signal Is to the output Z of the converter 502. This sense signal Is is provided to an input of the integrator 904 which integrates the sense signal Is to obtain an integrated signal Sint. The integrated signal Sint is provided to the quantiser 906 which quantises the integrated signal Sint and provides this quantised signal to the output of the measurement circuit 900 as the output signal DO and also to the DAC 908 to be converted into an analog output signal AO. The analog output signal AO is provided the second input Y of the converter 502. Thus, the circuit 900 acts as a sigma-delta modulator by utilising the negative feedback loop during quantisation by the quantiser 906 to a lower bit depth. And, like the circuits 500, 600, 700, 800 described above, the feedback loop acts to drive the analog output signal Ao to be the same as the sense voltage Vs across the cell 200. In doing so, the sense current Is at the first input X is forced to zero. Hence, loop acts to synthesize a large input resistance at the first input X (and therefore the input of the measurement circuit 900) without the need for a high impedance element at the input.

The embodiments described above have been focused on the converter 502 being a current conveyor. As noted above, however, the converter 502 may comprise any circuit element having the ability to establish on its first input a voltage equal to the voltage provided to its second input. Another example of such a circuit element is a transimpedance amplifier (TIA).

Figure 10:
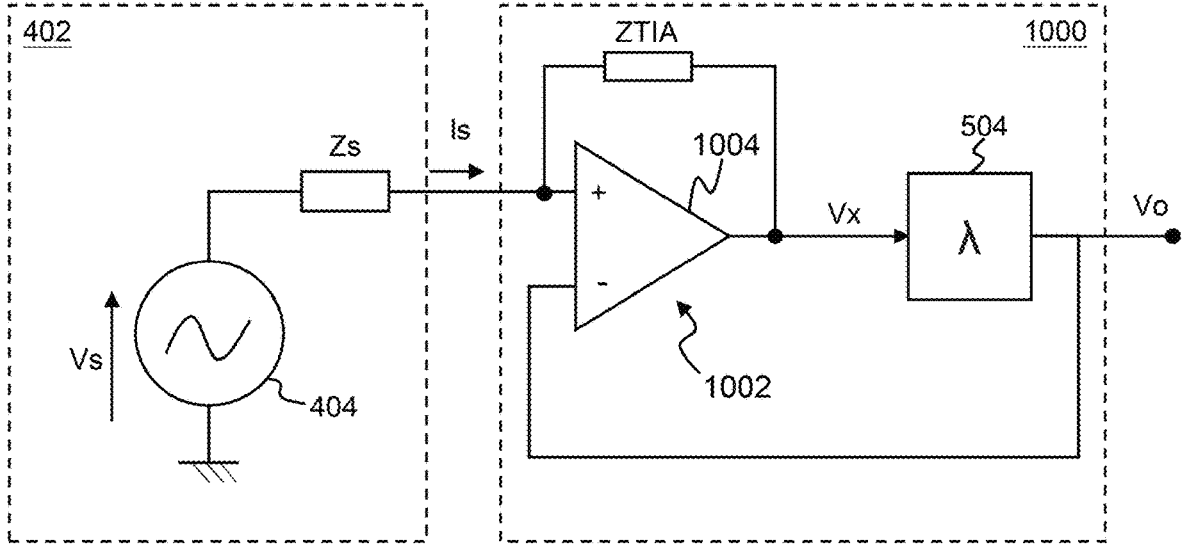

FIG. 10 is a schematic diagram of a measurement circuit 1000 which is a variation of the circuit 500 shown in FIG. 5, like parts being denoted with like numerals. The circuit 1000 differs from the circuit 500 of FIG. 5 in that the converter 502 has been replaced with a TIA 1002. The TIA 1002 comprises an op-amp 1004 and a feedforward impedance ZTIA. A first (non-inverting) input of the TIA 1002 is coupled to the cell 200 (equivalent circuit 402 shown). An output of the TIA 1002 is coupled to the input of the loop filter 504. The output of the loop filter 504 is coupled to the output of the measurement circuit 1000 and a second (inverting) input of the TIA 1002. The TIA 1002 is configured to output a voltage Vx which is proportional to the sense current Is at the input of the circuit 1000. The converted voltage Vx is then filtered by the loop filter 504 which outputs a filtered output voltage VO as the output to the circuit 1000. The output voltage VO is fed back via a feedback path to the inverting input of the TIA 1002. Like the converter 502, the TIA 1002 acts to establish at its first input a voltage equal to the voltage VO provided to its second input. Thus, the circuit 1000 of FIG. 10 acts in a similar manner to the current conveyor implementation, by synthesizing a large input impedance at the first input of the TIA 1002.

It will be appreciated that in the arrangement shown in FIG. 10, feedback is provided both via the feedback path between the output of the measurement circuit 1000 and the second input of the TIA 1002 and via the feedforward impedance ZTIA coupled between the output of the TIA 1002 and the first input of the TIA 1002. To maintain stability of the TIA 1002, it is preferable to ensure that the amount of negative feedback outweighs the amount of positive feedback. To do so, the op-amp 1004 of the TIA 1002 is arranged such that the main feedback path is coupled between the output of the circuit 1000 and the inverting input of the op-amp 1004 (as opposed to the non-inverting input of the op-amp 1004). This is in contrast to a more traditional TIA arrangement in which a non-inverting input is coupled to a reference voltage (e.g. ground) and an impedance is coupled between an inverting input and an output of the TIA.

The inventors have identified that the feedforward impedance ZTIA may itself have a filtering effect on the converted voltage Vx output from the TIA 1002. In which case, in some embodiments, the loop filter 504 may be omitted, such that the converted voltage Vx is provided as the output voltage VO at the output of the circuit 1000. In which case, the feedforward impedance ZTIA of the TIA 1002 may be set to implement the necessary gain which would otherwise have been applied by the omitted loop filter 504. In other words, the loop filter may be provided by the feedforward impedance ZTIA of the TIA 1002.

Figure 11:
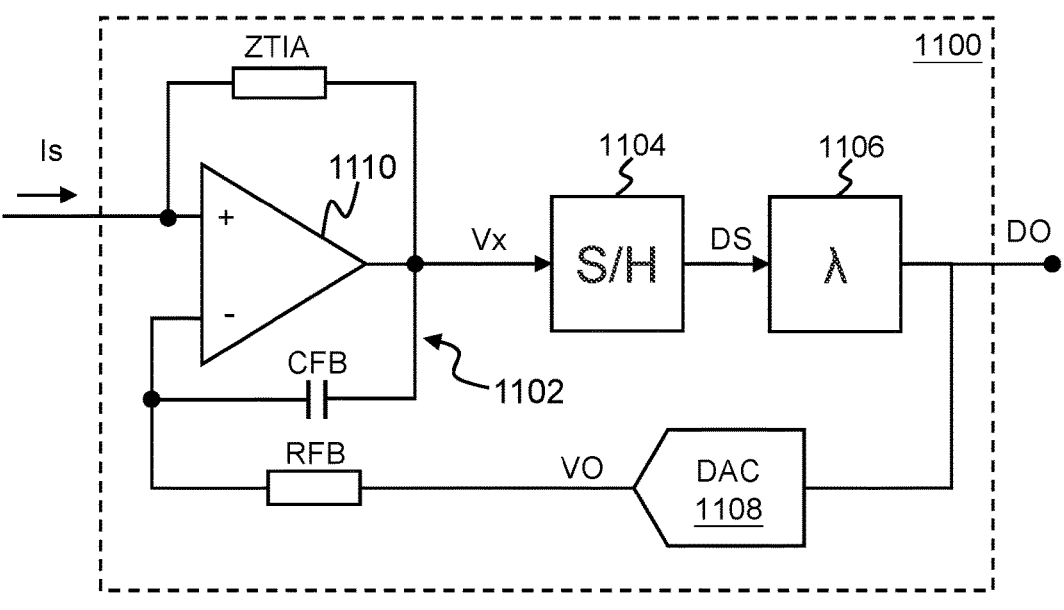

FIG. 11 is a schematic diagram of a measurement circuit 1100 which is a variation of the circuit 900 of FIG. 9 in which the converter 502 is implemented using a TIA 1102. The circuit 1100 comprises the TIA 1102, a sample and hold circuit 1104, a digital loop filter 1106, and a DAC 1108.

The TIA 1102 comprises an operational amplifier 1110, a feedforward impedance ZTIA and a feedback capacitance CFB. A first (non-inverting) input of the TIA 1110 is coupled to the cell 200 (not shown). An output of the TIA 1102 (and the op-amp 1110) is coupled to an input of the sample and hold circuit 1104. An output of the sample and hold circuit 1106 is coupled to an input of the loop filter 1106. An output of the loop filter 1106 is coupled to the output of the measurement circuit 1100 and also an input of the DAC 1108. An output of the DAC 1108 is coupled to a second (inverting) input of the op-amp 1110 via a feedback resistor RFB.

During operation, the TIA 1102 is configured to output a voltage Vx which is proportional to the current Is at its first input. The sample and hold circuit 1104 is configured to sample and hold the voltage Vx at its output to be provided to the loop filter 1106 as a digital signal DS. As such, the sample and hold circuit 1104 functions equivalently to the quantiser 906 of the circuit 900 of FIG. 9. The loop filter 1106 is then configured to output a filtered version of the digital signal DS output by the sample and hold circuit 1104 which is provided as the output DO and to the DAC 1108 to be converted into an analog voltage VO to be asserted at the second input of the TIA 1102.

Whilst feedback could otherwise be achieved purely via the DAC 1108, in practice, such feedback may not be fast enough to ensure stability of the TIA 1102. Additional feedback is therefore provided via the feedback capacitor CFB and the feedback resistor RFB. Specifically, high frequency feedback is obtained via the feedback capacitor CFB, and DC feedback through the feedback resistor RFB.

To further improve the circuit 1100 shown in FIG. 11, an additional loop may be provided to drive the voltage across the feedback capacitor CFB to DC (or zero). In doing so, the stability of the gain of the TIA 1102 would be improved as well as the transfer function of the sigma-delta modulator implemented by the circuit 1100.

Like the circuit 1000 of FIG. 10, in some embodiments the loop filter 1106 may be omitted, the gain otherwise applied by the loop filter 1106 implemented using the feedforward impedance ZTIA of the TIA 1102 (optionally in combination with the feedback capacitor CFB and/or the feedback resistor RFB.

It is noted that in all of the sigma delta modulator embodiments described herein, such as those implemented by the circuit 900, 1100 described above, higher-order integrators may be added through the addition of suitable capacitors and/or op-amps (as is known in the art). Any such implementations may preferably be implemented with suitable dither techniques, to improve behaviour and stability.

In the embodiments described above, a signal derived from an electrochemical cell is processed in some manner to determine a characteristic of the electrochemical cell. In some embodiments the signal may be derived from the cell without interrogation. For example, measurement of a battery or potentiometric sensor may simply involve measuring a potential difference across the cell. In some embodiments, however, the signal derived from the cell may be in response to driving the cell with a stimulus, for example electro-impedance spectroscopy (EIS).

To implement EIS, it is conventional to modulate a bias voltage, for example by applying a sine wave having a modulated frequency and/or amplitude. A response of the cell 200 to that sine wave, in the form of a sense signal, may be measured. The frequency of the sine wave may be adjusted over a range of frequencies in order to obtain a series of frequency dependent impedance measurements of the cell 200. Alternatively, one or more frequencies of interest may be known (identified, estimated, modelled or otherwise predetermined) such that the sine wave which is applied is at that frequency of interest. Each frequency of interest may be chosen to minimize variation in measurements or maximise a response of the cell for determining a particular characteristic.

Any one of the measurement circuits 500, 600, 700, 800, 900, 1000 may be modified to implement EIS.

Figure 12:
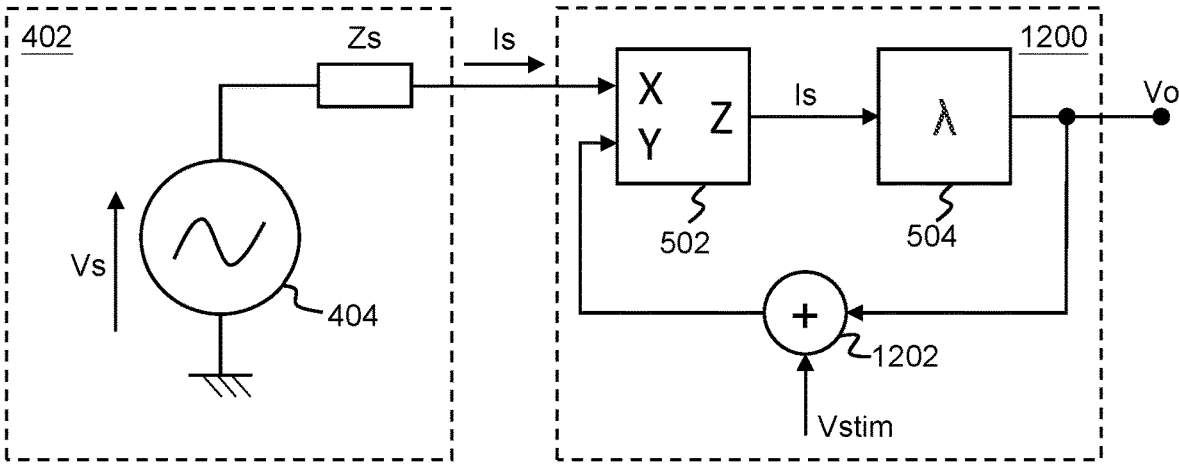

FIG. 12 is a schematic diagram of a measurement circuit 1200 which is a variation of the measurement circuit 500 of FIG. 5 modified for the performance of EIS measurements. Like parts have been given like numerals. The measurement circuit 1200 differs from the circuit 500 of FIG. 5 with the addition of a summing node 1202 between the output of the loop filter 504 and the second input Y of the converter 502. The summing node 1202 is configured to receive an EIS stimulus Vstim which is added at the summing node 1202 to the signal Vo fed back from the output of the loop filter 504. Since the potential at the first input X is equal to whatever voltage is applied to the second input Y, the stimulus Vstim is reflected onto the first input X which is coupled to the cell 200. Thus, the stimulus Vstim injected into the feedback path acts to apply a corresponding EIS stimulus to the cell 200.

As noted above, the stimulus Vstim may comprise a sine wave having a modulated frequency and/or amplitude. The frequency of the sine wave may be adjusted over a range of frequencies in order to obtain a series of frequency dependent impedance measurements of the cell 200. Alternatively, one or more frequencies of interest may be known (identified, estimated, modelled or otherwise predetermined) such that the sine wave which is applied is at that frequency of interest. Each frequency of interest may be chosen to minimize variation in measurements or maximise a response of the cell for determining a particular characteristic.

It will be appreciated that the circuits 600, 700, 800, 900, 1000, 1100 of FIGS. 6 to 12 may be modified in a similar manner to include a summing node (analog or digital) configured to inject an EIS stimulus into a respective feedback path.

It will be appreciated that the measurement circuits 500, 600, 700, 800, 900, 1000, 1100, 1200 described above may suffer from offset and drift. As such, offset calibration circuitry may be provided to correct offset and/or take into account drift. Such offset calibration circuitry may implement chopping to account for DC offset and flicker noise in respective measurement circuits. Such calibration circuitry may be configured to implement chopper stabilisation as is known in the art, for example, by switching the polarity of a respective measurement circuit at a chopping frequency which is significantly higher than the signal bandwidth. In doing so, any DC offset becomes a square wave at the chopping frequency which can easily be filtered out downstream. To correct the change in polarity, inverse switching circuitry may be implemented. As such, DC measurement error may be reduced or substantially eliminated.

Embodiments are described above with reference to cells 100, 200 comprising two electrodes (e.g. a working electrode WE and a counter electrode CE, or a reference electrode RE and a working electrode WE). Embodiments of the disclosure are not, however, limited to having cells having only one counter electrode or only one working electrode. The concepts described herein are particularly applicable to cells comprising multiple working electrodes or multiple counter electrodes. In doing so, such sensors may either providing redundancy or enabling the sensing of multiple analytes in a single chip. This may be particularly advantageous in applications such as continuous glucose monitoring, where it may be desirable to measure concentrations of several analytes including but not limited to two or more of glucose, ketones, oxygen, lactate, and the like. Moreover, the measurement circuits described herein may be configurable in different configurations for different types of measurements. Such measurements may be of the same or different cells or electrodes.

Figure 13:
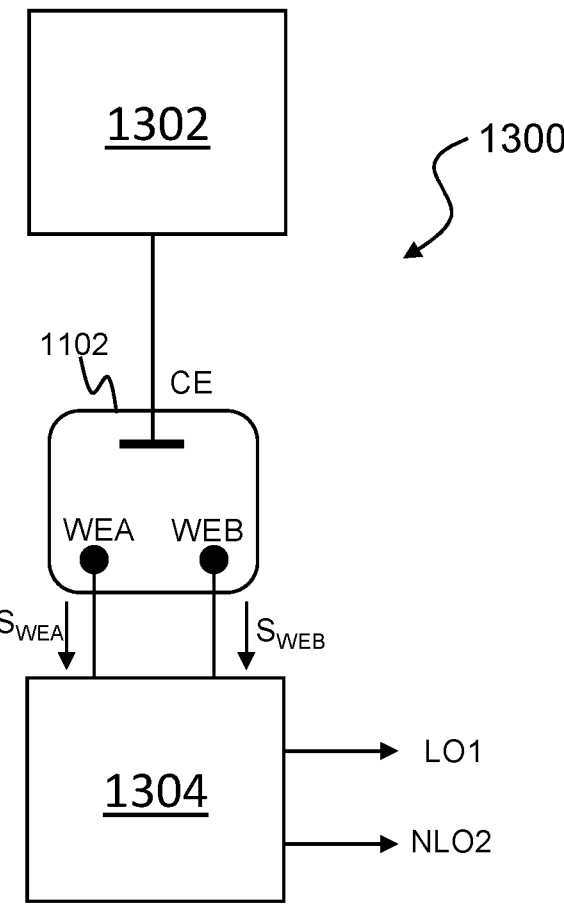

FIG. 13 illustrates an example measurement circuit 1300. In the circuit 1300, an electrochemical cell 1302 is shown comprising first and second working electrode WEA, WEB and a counter electrode CE. A measurement circuit 1304 is provided which is configured to output a first output signal S1 based on a signal $S_{WEA}$ derived from the first working electrode WEA and output a second output signal S2 based on a signal $S_{WEB}$ derived from the second working electrode WEB. The measurement circuit 1104 may, for example, comprise two processing channels, each processing channel implementing the circuitry described with reference to any of FIGS. 5 to 12. Alternatively, various components of the circuitry described with reference to FIGS. 5 to 12 may be shared between the two processing channels, e.g., through multiplexing or similar known techniques. Optionally, drive circuitry 1302 may be provided to drive the cell 1302 with a stimulus (for example if the cell 1302 is a potentiostat).

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Circuitry for processing an analyte signal obtained from an electrochemical cell, the circuitry comprising:
   a converter, comprising:
      a first converter input configured to receive the analyte signal;
      a second converter input; and
      a converter output configured to output a converted analyte signal, the converter configured to generate the converted analyte signal in dependence on the analyte signal;
   a loop filter configured to filter a signal derived from the converted analyte signal to obtain a filtered analyte signal at a filter output; and
   a feedback path between the filter output and the second converter input;
   wherein the feedback path is a configurable feedback path; and
   wherein the circuitry is operable in an open loop mode in which the configurable feedback path is broken and the loop filter is bypassed, and a closed loop mode in which the configurable feedback path is closed.

2. Circuitry of claim 1, wherein the circuitry is operated in the open loop mode when the measurement to be performed on the electrochemical cell is a potentiostatic measurement, and wherein the circuitry is operated in the closed loop mode when the measurement to be performed on the electrochemical cell is a potentiometric measurement.

3. Circuitry of claim 1, wherein the circuitry is operable in the open loop mode to apply a reference voltage at the second converter input when the feedback path is broken.

4. Circuitry of claim 1, wherein the loop filter is an analog filter.

5. Circuitry of claim 1, wherein the loop filter is a digital filter, the circuitry further comprising:
   an analog-to-digital converter (ADC) configured to convert the converted analyte signal to a digital analyte signal at an ADC output, wherein the signal derived from the converted analyte signal is the digital analyte signal; and
   a digital-to-analog converter (DAC) in the configurable feedback path, the DAC operable to convert the filtered analyte signal to an analog input signal at the second converter input.

6. Circuitry of claim 1, wherein the loop filter comprises an integrator.

7. Circuitry of claim 1, wherein the loop filter is a digital filter, the circuitry further comprising:
   an analog-to-digital converter (ADC) configured to convert the converted analyte signal to a digital analyte signal at an ADC output, wherein the signal derived from the converted analyte signal is the digital analyte signal; and
   a digital-to-analog converter (DAC) in the configurable feedback path, the DAC operable to convert the filtered analyte signal to an analog input signal at the second converter input,
   wherein the loop filter is selectively coupled between the ADC output and the configurable feedback path, wherein:
   in the open loop mode, the circuitry is configured to bypass the loop filter; and in the closed loop mode, the circuitry is configured to couple the loop filter between the ADC output and the configurable feedback path.

8. Circuitry of claim 1, further comprising control circuitry configured to adapt the loop filter in dependence on the analyte signal.

9. Circuitry of claim 1, wherein the converter comprises a current conveyor.

10. Circuitry of claim 1, wherein the converter comprises a transimpedance amplifier (TIA).

11. Circuitry of claim 10, wherein the loop filter comprises a feedforward impedance of the TIA, the feedforward impedance coupled between the converter output and the first converter input.

12. Circuitry of claim 1, wherein the converter is configured to mirror a voltage at the second converter input at the first converter input.

13. Circuitry for processing an analyte signal obtained from an electrochemical cell, the circuitry comprising:
   a converter, having a first converter input for receiving the analyte signal, a second converter input and a converter output for outputting a converted analyte signal, the converter configured to establish, on the first converter input, a voltage equal to a voltage provided to the second converter input;
   a loop filter configured filter the converted analyte signal to generate a filtered analyte signal at a filter output;
   a feedback path between the filter output and the second converter input.

14. Circuitry of claim 13, wherein the loop filter is an analog filter, wherein the filter is configured such that a magnitude of the filtered converted analyte signal is substantially equal to a magnitude of the analyte signal.

15. Circuitry of claim 13, further comprising:
   an analog-to-digital converter (ADC) coupled between the converter output and the loop filter, the ADC configured to digitize the filtered converted analyte signal to obtain a digital analyte signal; and
   a digital-to-analog converter (DAC) coupled in the feedback path between the filter output and the second converter input, the DAC configured to convert the digital analyte signal to an analog input signal at the second converter input.

16. Circuitry of claim 13, wherein the loop filter comprises an integrator, wherein the circuitry further comprises:
   a quantiser coupled between the loop filter and the feedback path, the quantiser configured to quantise the filtered analyte signal to generate a digital output signal; and
   a digital-to-analog converter (DAC) provided in the feedback path, the DAC configured to convert the digital output signal to an analog input signal at the second converter input.

17. Circuitry of claim 13, further comprising:
   control circuitry operable to switch the circuitry between a potentiometric mode and a potentiostatic mode, wherein in the potentiostatic mode, the control circuitry is operable to break the feedback path and apply a reference voltage at the second converter input.

18. Circuitry of claim 13, further comprising:
   control circuitry configured to adapt the loop filter in dependence on the analyte signal.

19. An integrated circuit (IC), comprising:
   the circuitry of claim 1; and
   an external pin for configuring the circuitry in one of the open loop and closed loop modes.

20. An integrated circuit (IC), comprising:

first channel circuitry for processing a first analyte signal from a first electrochemical sensor; and second channel circuitry for processing a second analyte signal from a second electrochemical sensor, wherein the first and second channels each comprise the circuitry of claim 1.

21. A multi-analyte sensor, comprising:

the IC of claim 20;

the first electrochemical sensor; and the second electrochemical sensor.

22. A system comprising:

the circuitry of claim 1;

the electrochemical cell.

23. The system of claim 22, wherein:

the electrochemical cell comprising a counter electrode and a first working electrode; and the first electrode is the first working electrode of the electrochemical cell.

24. The system of claim 23, wherein the electrochemical cell comprises a second working electrode, or wherein the electrochemical cell comprises an anode and a cathode, wherein the first electrode is the cathode.

25. An electronic device, comprising the circuitry of claim 1, wherein the electronic device comprises one of an analyte monitoring device or an analyte sensing device, a battery, a battery monitoring device, a mobile computing device, a laptop computer, a tablet computer, a games console, a remote control device, a home automation controller or a domestic appliance, a toy, a robot, an audio player, a video player, or a mobile telephone, and a smartphone.

26. Circuitry for processing an analyte signal obtained from an electrochemical cell, the circuitry comprising:

a converter, comprising:

a first converter input configured to receive the analyte signal;

a second converter input; and a converter output configured to output a converted analyte signal, the converter configured to generate the converted analyte signal in dependence on the analyte signal;

a loop filter configured to filter a signal derived from the converted analyte signal to obtain a filtered analyte signal at a filter output; and a feedback path between the filter output and the second converter input;

wherein the converter comprises a transimpedance amplifier (TIA); and wherein the loop filter comprises a feedforward impedance of the TIA, the feedforward impedance coupled between the converter output and the first converter input.

27. Circuitry for processing an analyte signal obtained from an electrochemical cell, the circuitry comprising:

a converter, comprising:

a first converter input configured to receive the analyte signal;

a second converter input; and a converter output configured to output a converted analyte signal, the converter configured to generate the converted analyte signal in dependence on the analyte signal;

a loop filter configured to filter a signal derived from the converted analyte signal to obtain a filtered analyte signal at a filter output; and a feedback path between the filter output and the second converter input;

wherein the converter is configured to establish, on the first converter input, a voltage equal to a voltage provided to the second converter input.

28. An integrated circuit (IC), comprising:

first channel circuitry for processing a first analyte signal from a first electrochemical sensor; and second channel circuitry for processing a second analyte signal from a second electrochemical sensor, wherein the first and second channels each comprise:

a converter, comprising:

a first converter input configured to receive the analyte signal;

a second converter input; and a converter output configured to output a converted analyte signal, the converter configured to generate the converted analyte signal in dependence on the analyte signal;

a loop filter configured to filter a signal derived from the converted analyte signal to obtain a filtered analyte signal at a filter output; and a feedback path between the filter output and the second converter input.

29. A system comprising:

an electrochemical cell comprising a counter electrode and a first working electrode; and circuitry for processing an analyte signal obtained from the electrochemical cell, the circuitry comprising:

a converter, comprising:

a first converter input configured to receive the analyte signal;

a second converter input; and a converter output configured to output a converted analyte signal, the converter configured to generate the converted analyte signal in dependence on the analyte signal;

a loop filter configured to filter a signal derived from the converted analyte signal to obtain a filtered analyte signal at a filter output; and a feedback path between the filter output and the second converter input.

* * * * *